May 6, 1969 R. L. FJERSTAD 3,443,247
VARACTOR MODULATOR HAVING A LINEAR TUNING
VOLTAGE vs FREQUENCY RESPONSE
Filed March 31, 1966 Sheet 1 of 2
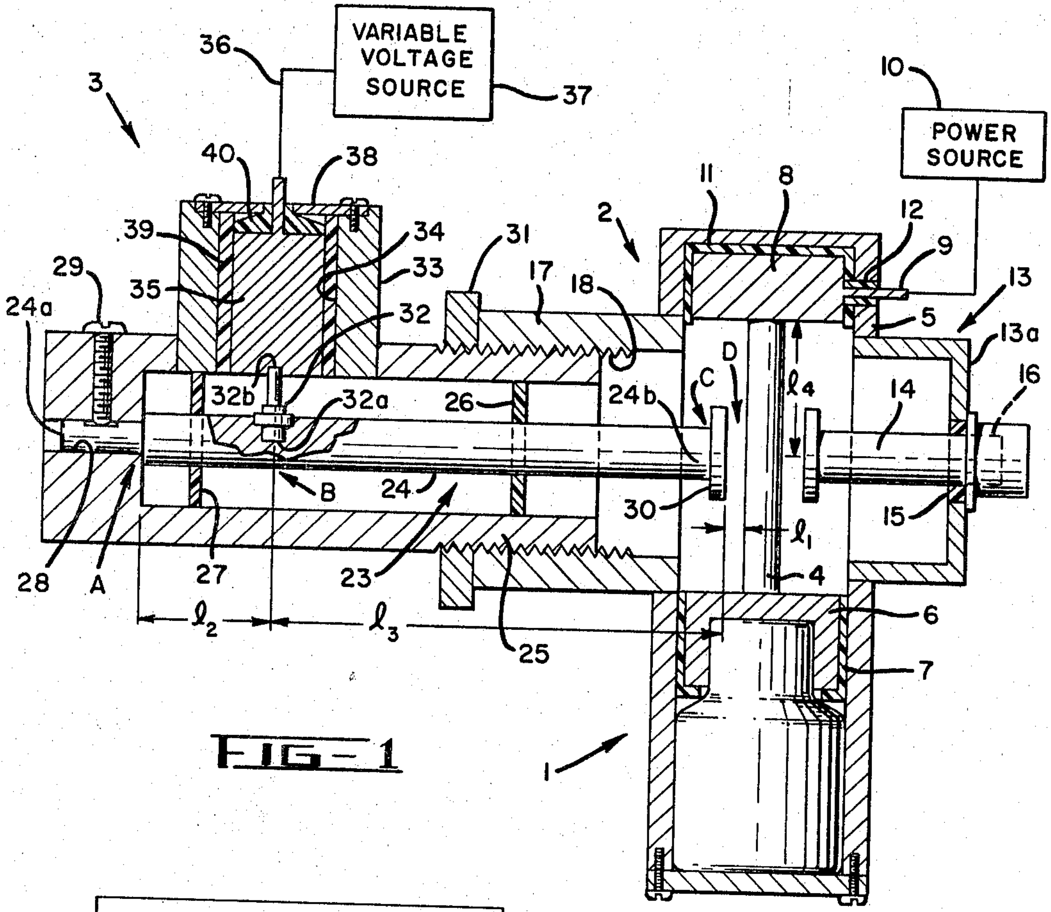
FIG-1
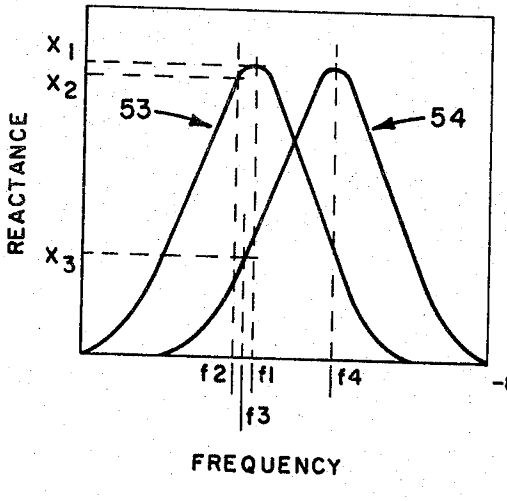
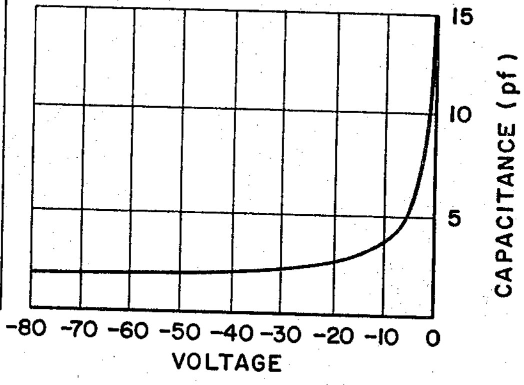
FIG-5
INVENTOR.
ROGER L. FJERSTAD
FIG-9
BY John F. Lawler
ATTORNEY

INVENTOR.
ROGER L. FJERSTAD

BY John F. Lawler
ATTORNEY

United States Patent Office 3,443,247

Patented May 6, 1969

3,443,247

VARACTOR MODULATOR HAVING A LINEAR TUNING VOLTAGE vs. FREQUENCY RESPONSE

Roger L. Fjerstad, Sunnyvale, Calif., assignor to Sylvania Electric Products Inc., a corporation of Delaware Filed Mar. 31, 1966, Ser. No. 539,056
Int. Cl. H03c 3/20
U.S. Cl. 332—30 1 Claim

ABSTRACT OF THE DISCLOSURE

This modulator includes a tuned circuit that is coupled through a coaxial transmission line to the coaxial cavity connected to the output of an oscillator tube. The spacing between the inner and outer conductors of the coaxial line is small. The tuned circuit includes a varactor diode connected between the center of the inner conductor and the outer conductor of the coaxial line and a length of the coaxial line between the diode and a short circuit of the inner and outer conductors at the opposite end of the coaxial line from the cavity. A bias voltage applied to the diode is varied at a linear rate to change the diode capacitance and thus the tuned circuit reactance that is coupled to the cavity. This causes the resonant frequency of the cavity and the operating frequency of the modulator to change at a substantially linear rate.

This invention relates to modulators and more particularly to electronically-tuned frequency modulators.

In moving target indicator doppler radar systems, the radar transmitter may be frequency modulated to improve the range discrimination of the system. It is desirable to employ an electronically-tuned frequency modulator in such applications since these modulators are easily adaptable to remote tuning. One prior art electronically-controlled frequency modulator has a varactor diode directly connected between the inner and outer conductors of a coaxial cavity associated with an oscillator tube. A variable DC bias voltage applied to the diode controls its capacitance, as well as the resonant frequency of the cavity and the operating frequencies of the modulator. Since the capacitance of the varactor diode is a nonlinear function of the DC bias voltage, a nonlinear bias voltage (as a function of time) must be applied to th diode in order to change the operating frequency of the modulator linearly as a function of time. In practice, it is difficult to match the time variation of the bias voltage to the capacitance characteristic of the varactor diode, such that the time variation of the operating frequency of the modulator is linear.

An object of this invention is the provision of an electronically-controlled frequency modulator whose operating frequencies are a linear function of an applied DC bias voltage which varies linearly as a function of time.

Briefly, this invention includes a tuned circuit, which includes a varactor diode, which is coupled through a length of transmission line to the cavity associated with an oscillator tube. When the varactor diode is biased to have a large capacitance, the tuned circuit is resonant at a frequency which is greater than the operating frequencies of the modulator. The impedance of the tuned circuit that is coupled to the cavity has a large inductive component which loads the cavity so that the lowest operating frequency of the modulator is only slightly less than the resonant frequency of the circuit comprising the transmission line and the tunded circuit. As the bias voltage applied to the varactor diode is increased (made more negative), the diode capacitance and inductive impedance coupled to the cavity decrease and cause the resonant frequency of the cavity and the operating frequency of the modulator to increase at a substantially linear rate.

This invention will be more fully understood from the following description, together with the accompanying drawings in which:

FIGURE 1 is a transverse section of a modulator embodying this invention;

FIGURE 5 is a curve showing the variation of the capacitance of the varactor diode as a function of DC bias voltage;

FIGURE 9 is a curve which shows the resonant characteristic (reactance vs. frequency) of a circuit of the modulator of FIGURE 1.

Figure 4:
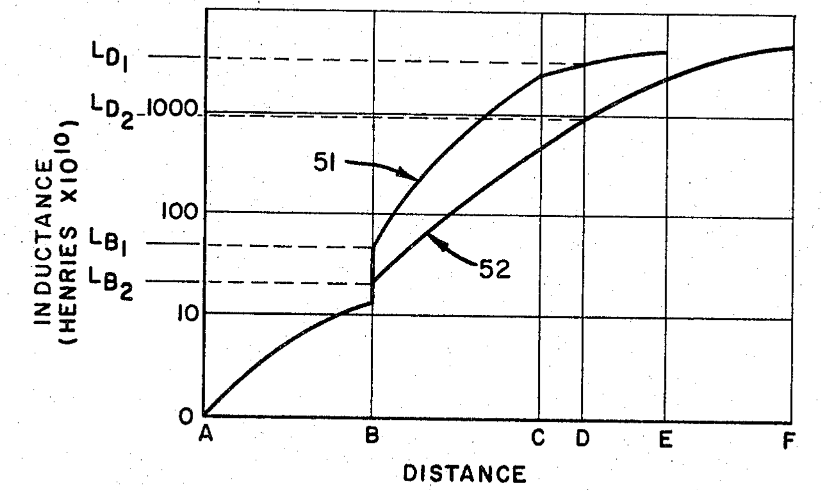
FIGURE 4 is a curve which illustrates the operation of this invention.

Referring to FIGURE 1, the modulator comprises an electron discharge device 1 such as an oscillator tube which may be a reflex klystron, a coaxial cavity 2, and a modulation circuit 3. Coaxial cavity 2 is connected to the oscillator tube and determines the operating frequency of the modulator. Modulation circuit 3 is coupled to the cavity and controls its resonant frequency and thus the operating frequency of the modulator.

Cavity 2 is a coaxial transmission line which is short-circuited at one end and has an electrical length which is less than a quarter wavelength at the operating frequencies of the modulator. The cavity comprises an inner conductor 4 and an outer conductor 5. One end of inner conductor 4 is connected through an electrically-conductive cap 6 to the plate electrode of oscillator tube 1. Cap 6 is insulated from outer conductor 5 by a sleeve 7 which is made of electrically nonconductive material such as Teflon. The thickness of sleeve 7 determines the capacitance between cap 6 and conductor 5 and thus the electrical length of coaxial transmission line comprising the cavity 2.

The other end of inner conductor 4 is electrically connected through choke joint 8 and lead 9 to a power source 10. Choke joint 8 is effectively a short circuit between conductors 4 and 9 at DC and electrically connects power source 10 to oscillator tube 1. Choke joint 8 and lead 9 are insulated from outer conductor 5 by cup member 11 and sleeve 12, respectively, which are made of electrically nonconductive material such as Teflon. The thicknesses of cup member 11 and sleeve 12 are such that the choke joint is electrically connected to outer conductor 5 at the operating frequencies of the modulator. Choke joint 8 and cup 11 provide a short circuit between inner conductor 4 and outer conductor 5 at the operating frequencies of the modulator in order to prevent high frequency signals from passing to the power source.

Outer conductor 5 has a cylindrical extension 13 with an outer wall 13_a_ which supports a probe 14 within the cavity. Probe 14 is electrically insulated from wall 13_a_ by a sleeve 15 made of electrically nonconductive material such as Teflon. An output signal is coupled from the cavity by probe 14 the outer end 16 of which is connected to the output connector for the modulator. A similar cylindrical extension 17 having a threaded bore 18 projects from the opposite side of the cavity and provides a mechanical and electrical connection between the cavity 2 and circuit 3.

Modulation circuit 3 comprises a coaxial transmission line 23 having an inner conductor 24 supported in outer conductor 25 by dielectric spacer rings 26 and 27. One end 24a of inner conductor 24 is secured in an opening 28 in outer conductor 25 and is short-circuited to the adjacent end of outer conductor 25 at point A. Inner conductor 24 is restrained from movement relative to outer conductor 25 by screw 29.

The opposite end 24b of inner conductor 24 extends into cavity 2 and has a coupling disc 30 connected thereto. Disc 30 is proximate to the inner conductor 4 of the cavity and capacitively couples the modulation circuit 3 to the cavity; the capacitive coupling is a function of the spacing $l_1$ between disc 30 and conductor 4. Outer conductor 25 is externally threaded and engages the threads in bore 18 of extension 17 to permit movement of transmission line 23 relative to cavity 2 for varying the spacing $l_1$. This enables adjustment of the capacitive coupling and of the electrical phase length between the short circuit at point A and inner conductor 4. Locknut 31 secures the parts in relatively fixed positions after this adjustment.

A varactor diode 32 has one terminal 32a located in a recess in and electrically connected to inner conductor 24 at a position B which is axially spaced a distance $l_2$ from the short-circuited end of coaxial transmission line 23 (point A) and a distance $l_3$ from the end of disc 30.

A tubular extension 33 is radially connected to and projects from outer conductor 25 adjacent the short-circuited end A of coaxial transmission line 23. Extension 33 has a bore 34 which is coaxial with the varactor diode and houses a conductive member 35 which is electrically connected to the outwardly projecting terminal 32b of the diode. The varactor diode is electrically connected through member 35 and lead 36 to a source 37 of variable DC bias control voltage. Member 35 is secured in extension 33 by a cap 38 and is insulated from extension 33 and cap 38 by sleeve 39 and cap 40, respectively, made of electrically nonconductive material such as Teflon. The thickness of sleeve 39 is such that conductive member 35 is electrically connected to extension 33 and outer conductor 25 at the operating frequencies of the modulator.

Figure 2:
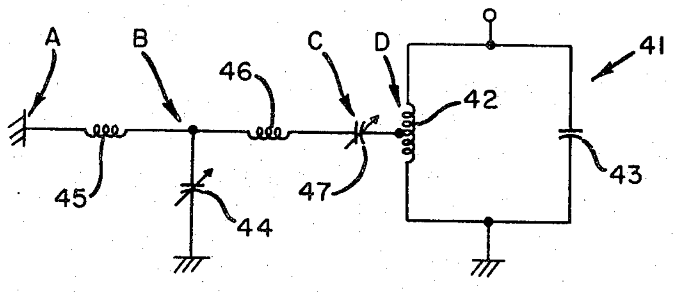
FIGURES 2 and 3 are schematic diagrams of equivalent circuits of the modulator of FIGURE 1.
Figure 3:
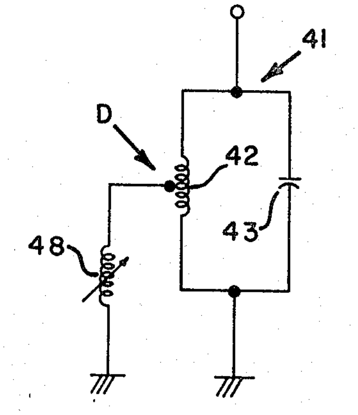

The equivalent circuit of coaxial cavity 2 is illustrated at 41 in FIGURES 2 and 3 and comprises an inductor 42 and a capacitor 43. (The equivalent inductance and the equivalent capacitance of the cavity are determined in accordance with conventional techniques described in Microwave Transmission Circuits, Rad Lab Series, by G. L. Ragen, page 614, McGraw Hill Book Co., Inc., 1948.) The capacitance of varactor diode 32 is represented by variable capacitor 44 which is connected between point B (inner conductor 24 in FIGURE 1) and a ground reference potential (member 35 and outer conductor 25 in FIGURE 1). The length $l_2$ (see FIGURE 1) of coaxial transmission line is represented by inductor 45 connected between ground and point B such that it is in parallel with the varactor diode (variable capacitor 44). This length $l_2$ of coaxial transmission line is such that when variable capacitor 44 has a minimum capacitance, inductor 45 is shunt resonant with capacitor 44 at a frequency greater than the operating frequencies of the modulator. The length $l_3$ of transmission line is represented by inductor 46. The coupling capacitance of disc 30 and inner conductor 4 is represented by variable capacitor 47 which is in series with inductor 46. The inductance of inductor 46 (the length $l_3$ of transmission line 23) and the capacitance of capacitor 47 are such that when variable capacitor 44 has a maximum capacitance, modulation circuit 3 (inductors 45 and 46 and capacitors 44 and 47) is resonant at a frequency $f_1$ that is only slightly larger than the lowest operating frequency $f_2$ of the modulator (see FIGURE 9).

Capacitor 47 couples the adjacent circuits such that the circuit to the left of point D, as viewed, is connected in shunt with a part of the cavity inductor 42 and loads the coaxial cavity. The portion of the circuit to the left (as viewed) of point D is represented in FIGURE 3 by variable inductor 48.

The electrical phase length $\psi$ between the short circuit at point A and point D is greater than the electrical length $\psi'$ of transmission line 23 therebetween. The effect of capacitor 44 (the varactor diode 32) is to increase the electrical phase length $\psi$ without changing the physical length of transmission line 23. Capacitor 44 also provides a mechanism for varying the electrical phase length $\psi$, and thus the inductance of inductor 48, the resonant frequency of coaxial cavity 2, and the operating frequency of the modulator as will be explained more fully hereinafter.

The effect of capacitor 47 is to decrease the electrical phase length $\psi$. Capacitor 47 also provides DC isolation between inner conductors 24 and 4 (FIGURE 1) and is adjusted by change of the spacing $l_1$ in order to compensate for variations in the capacitances of different varactor diodes. The electrical phase length $\psi$ is less than a quarter wavelength at the operating frequencies of the modulator.

In operation, a minimum DC bias voltage from voltage source 37 (see FIGURE 1) is applied to varactor diode 32 so that its capacitance (i.e., the capacitance of variable capacitor 44 in FIGURE 2) has a large value. The inductance of inductor 45 is shunt resonant with this capacitance of capacitor 44 at a frequency greater than the highest modulator frequency so that the impendance at point B is inductive at the lowest operating frequency of the modulator. The circuit between point A and point D. which is similar to a length of transmission line having an electrical phase length $\psi$ that is frequency dependent, is an impedance transformer. Thus, capacitor 47 and inductor 46 (FIGURE 2) transform the impedance at point B to an impedance at point D which has a larger inductive component than the impedance at point B as illustrated in FIGURE 4 and described more fully hereinafter. This inductive impedance at point D is represented in FIGURE 3 by variable inductor 48.

FIGURE 4 includes two plots of the effective inductance (which is related to the impedance) of modulation circuit 3 (the circuit between point A and point D) as a function of distance from the short circuit at point A. The ordinate axis of FIGURE 4 is a logarithmic plot of values of the effective inductance which produces the inductive component of the impedance of the modulation circuit. The coordinate axis of FIGURE 4 is a plot (not to scale) of the axial distance from the short circuit at point A. Reference to the plots of FIGURE 4 reveals that the effective inductance (which causes the inductive component of impedance) increases abruptly at point B, due to the effect of the varactor diode, and increases sharply to the right of point B (as viewed). Plot 51 shows the variation of the effective inductance when varactor diode 32 is biased to have a larger capacitance. Plot 52 shows the variation of the effective inductance when the varactor diode is biased to decrease its capacitance to increase the operating frequency of the modulator. Reference to plot 51 shows that the inductance $L_{D_1}$ at point D is larger than the corresponding inductance $L_{B_1}$ at point B. The quarter wave-length point E of plot 51 is to the right of point D in FIGURE 4.

Figures 6, 7, 8:
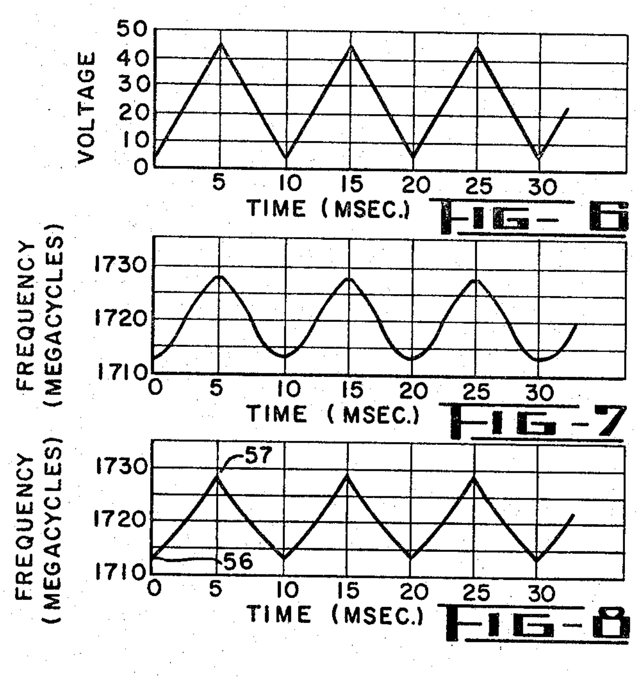
FIGURE 6 is a waveform showing the variation of DC bias voltage on the diode.
FIGURE 7 is a waveform showing the variation of the operating frequency of a prior art varactor modulator when a nonlinear DC bias voltage, as a function of time, is applied thereto in an attempt to linearize the response characteristic (frequency vs. time waveform) thereof.
FIGURE 8 is a waveform showing the variation of the operating frequency of the varactor modulator illustrated in FIGURE 1 when the linear DC bias voltage illustrated in FIGURE 6 is applied thereto.

When the bias voltage applied to the varactor diode is increased (made more negative), the capacitance of capacitor 44 decreases, see FIGURE 5. This decrease in the capacitance of capacitor 44 shunting the transmission line at point B, see FIGURE 2, decreases the electrical length between point A and the cavity and causes the quarter wave-length point to shift farther to the right (as viewed in FIGURE 4) of point D to point F. This operation is illustrated in FIGURE 4 by the plot 52 which shows that this decrease in the capacitance of the varactor diode causes the inductances $L_{B_1}$ and $L_{D_1}$ at points B and D, respectively, to decrease to the inductances $L_{B_2}$ and $L_{D_2}$. This decrease in the inductance of variable inductor 48 to the inductance $L_{D_2}$ causes the resonant frequency of coaxial cavity 2 and the operating frequency of the modulator to increase. The rate of change of capacitance of the varactor diode is a nonlinear function of the DC bias voltage (see FIGURE 5). When the varactor diode is connected in a coaxial cavity between the inner conductor and the outer conductor and a bias voltage which varies nonlinearly as a function of time is applied to the varactor diode in an attempt to linearize the response characteristic thereof, the rate of change of the operating frequency of this prior art modulator as a function of time is still nonlinear as illustrated in FIGURE 7. When the varactor diode is coupled to the cavity in accordance with this invention as illustrated in FIGURE 1 and the DC bias voltage that is applied to the varactor diode is varied linearly as illustrated in FIGURE 6, the rate of change of the operating frequency of the modulator as a function of time is substantially linear as illustrated by the waveform of FIGURE 8.

The manner in which this invention compensates for the effect of the nonlinear capacitance versus bias voltage characteristic (FIGURE 5) of varactor diode 32 to provide a linear response characteristic (frequency versus linearly varying DC bias voltage or time) from the modulator is seen by considering the resonance characteristic of modulation circuit 3 which is represented by curve 53, see FIGURE 9. The modulation circuit is a resonant circuit whose resonant frequency $f_1$ and reactance, see FIGURE 9 (represented by the inductor 48 which loads coaxial cavity 2) vary at substantially the same rate as the capacitance of the varactor diode. When the diode capacitance is large, the resonant frequency $f_1$ of the modulation circuit is approximately equal to the lowest operating frequency $f_2$ (see FIGURE 9) of the modulator so that the reactance $X_2$ which loads the cavity is large. Since the circuit inductance (inductor 48) which produces the reactance $X_2$ is also large, it has little effect on the operating frequency of the modulator. Reference to FIGURE 5 reveals that the rate of change of diode capacitance as a function of bias voltage is large for large values of diode capacitance. Thus, the rate of change of the circuit inductance and the resonant frequency of the modulation circuit as a function of the bias voltage are also large. This means that the circuit inductance and the resonant frequency of modulation circuit 3 change rapidly when diode 32 has a large capacitance and a linearly varying bias voltage is applied thereto. Since the circuit inductance which loads cavity 2 is large, however, the effect of the very nonlinear variation of diode capacitance (and the effect of circuit inductance) on the operating frequency of the modulator is decreased so that the response characteristic of the modulator is substantially linear.

When the varactor diode is biased to have a small capacitance, the operating frequency of the modulator is increased from the frequency $f_2$ to the frequency $f_3$, and modulation circuit 3 has a resonant frequency $f_4$ and the resonance characteristic represented by the curve 54 (see FIGURE 9). Since the diode capacitance is small, the reactance $X_3$ (produced by inductor 48) of modulation circuit 3 which loads the cavity 2 is smaller than in the previous example and therefore has a greater effect on the operating frequency of the modulator. Reference to FIGURE 5 reveals that the rate of change of diode capacitance as a function of bias voltage is small for small values of diode capacitance. This means that the circuit inductance (which produces the reactance $X_3$) of modulation circuit 3 changes slowly when diode 32 has a small capacitance. Since the circuit inductance which loads cavity 2 is small, however, it accentuates the effect of the small but nonlinear variation of diode capacitance and circuit inductance on the operating frequency of the modulator so that the response characteristic of the modulator is substantially linear as illustrated by the waveform of FIGURE 8.

The following analysis of the operation of this invention also shows how modulation circuit 3 compensates for the nonlinear rate of change of the capacitance of the varactor diode at low DC bias voltages to provide a substantially linear rate of change of the operating frequency of the modulator as a function of a linearly varying bias voltage. The resonant frequency $\omega_c$ of coaxial cavity 2 in radians per second is representable as $$\omega_c=\sqrt{\frac{1}{LC_c}} \tag{1}$$

$$=\sqrt{\frac{1}{L_cC_c}+\frac{1}{L_tC_c}} \tag{2}$$

where $C_c$ is the capacitance of the coaxial cavity (capacitor 43), $L_c$ is the inductance of the coaxial cavity (inductor 42), $L_t$ is the transformed inductance (inductor 48) which shunts the cavity (inductor 48 is assumed to be connected in shunt with all of inductor 42 for illustrative purposes), and L is the equivalent inductance of the parallel combination of the cavity inductance $L_c$ and the transformed inductance $L_t$ (inductors 42 and 48, respectively, in FIGURE 3).

The inductance $L_t$ is a function of the inductance $L_B$ at point B (the inductance defined by the reactance at point B divided by the radian frequency $\omega_c$). The inductance $L_t$ is determined from the impedance of the circuit as viewed from the right to left at point D in FIGURE 2 (the impedance derived from Equation 3–35, page 50, Electric Transmission Lines by H. H. Skilling, McGraw Hill Book Company, Inc., 1951, and the reactance of capacitor 47). The inductance $L_B$, however, is a function of the capacitance $C_d$ of the varactor diode and is determined from the impedance of the length $l_2$ of short-circuited coaxial transmission line which is shunted by the varactor diode (the impedance derived from Equation 3–37, page 50, Electric Transmission Lines, supra, modified to include the effect of capacitor 44). Thus, the transformed inductance $L_t$ is a function of the diode capacitance $C_d$ and may be represented as a function of a series expansion of the diode capacitance $C_d$.

Substituting the value of $L_t$ in Equation 2 and simplifying the resulting equation, the absolute value of the rate of change of the radian resonant frequency $\omega_c$ of the coaxial cavity as a function of the diode capacitance $C_d$ of the varactor diode $$\left|\frac{d\omega_c}{dC_d}\right|$$

is, to a very rough approximation, equal to $$\left|\frac{K\omega_c}{C_c(\omega_cK'\cos\theta+\omega_cK''C_d\cos\theta+Z_0\sin\theta)^2}\right| \tag{3}$$

where K, K′, and K″ are constants, $\theta$ is the electrical length of the coaxial transmission line 23 between point B and disc 30 and $Z_0$ is the characteristic impedance of coaxial transmission line 23. Reference to Equation 3 reveals that the rate of change of the radian resonant frequency $\omega_c$ of the cavity as a function of the diode capacitance $C_d$ is less for large than for small values of diode capacitance $C_d$. Reference to FIGURE 5, however, reveals that the rate of change of diode capacitance $C_d$ as a function of the DC bias voltage is greater for low than for high bias voltages. Since the rate of change of the radian resonant frequency $\omega_c$ of the cavity as a function of the diode capacitance $C_d$ and the rate of change of the diode capacitance $C_d$ as a function of the DC bias voltage V vary inversely, the effect of modulation circuit 3 is to compensate for the nonlinear variation of diode capacitance $C_d$ as a function of the bias voltage so that the radian resonant frequency $\omega_c$ of the coaxial cavity and the operating frequency of the modulator are substantially linear functions of the bias voltage V. This effect is illustrated graphically by the waveform of FIGURE 8.

The modulator having the output illustrated in FIGURE 8 was constructed with the following dimensions, components, and operating characteristics:

| | | |
|---|---|---|
| Oscillator (tube **1** and cavity **2**) (EIMAC) | | X4564 |
| Oscillator tube **1** | | GE7913 |
| Coaxial cavity **2**: | | |
| Outer conductor **5**— | | |
| Inner diameter | inch | 0.813 |
| Inner conductor **4**— | | |
| Length $l_4$ | do | 0.270 |
| Length (overall) | do | 0.430 |
| Diameter | do | 0.273 |
| Coaxial transmission line **23**: | | |
| Outer conductor **25**— | | |
| Inner diameter | do | 0.250 |
| Inner conductor **24**— | | |
| Diameter | do | 0.100 |
| Length $l_2$ | do | 0.375 |
| Length $l_3$ | do | 0.910 |
| Disc **30**— | | |
| Diameter | do | 0.236 |
| Spacing $l_1$ (adjustable) | do | $\approx$0.030 |
| Varactor diode (Microwave Associates) | | MA-4057D1 |
| Capacitance $C_d$ (for −6 volts and −50 volts bias) | pfd | 4.2 and 2.0 |
| Bias voltage | volts | 4.5 to 45 |
| Center frequency | c.p.s. | 1720M |
| Modulation frequency | c.p.s. | 100 |
| Frequency deviation (1712.5 to 1727.5M c.p.s.) | mc | 15 |
| Linearity | | 1.2 |

The linearity of the output (FIGURE 8) of the modulator is defined as the ratio of the maximum rate of change of the frequency as a function of time $[df/dt]_{max}$ to the minimum rate of change of frequency as a function of time $[df/dt]_{min}$ between the inflection points 56 and 57 of the output. The linearity of the output of the modulator incorporating this invention which is illustrated by the waveform of FIGURE 8 is 1.2, whereas the linearity of the output of the prior art modulator which is illustrated by the waveform of FIGURE 7 is 3.42.

What is claimed is:

1. A frequency modulator having a linear output frequency versus tuning voltage characteristics comprising
   - a first tuned circuit,
   - an oscillator tube generating an oscillating output signal,
   - first means coupling the output of said oscillator to said first tuned circuit,
   - second means coupling an output of the modulator from said first tuned circuit,
   - a coaxial transmission line having inner and outer conductors and having first and second sections,
   - means for short-circuiting said inner and outer conductors at one end of said coaxial transmission line,
   - third means for coupling the other end of said coaxial transmission line to said first tuned circuit,
   - a source of DC bias voltage,
   - a second tuned circuit comprising
     - a varactor diode spaced from said short circuiting means at said one end of said transmission line and connected between the center of said inner conductor and said outer conductor at the operating frequencies of said modulator, and
     - the first section of said coaxial transmission line between said one end thereof and said varactor diode,
       - said first section having an electrical length providing an inductance that is shunt resonant with a maximum capacitance of said diode at a frequency greater than the operating frequencies of the modulator, the impedance of said second tuned circuit having an inductive reactance that is a function of the reactance of said diode at the operating frequencies of the modulator,
   - fourth means connecting said bias voltage to said varactor diode,
   - said second section of said coaxial transmission line between the other end thereof and said diode having an electrical phase length that transforms the inductive reactance of said second tuned circuit to a larger inductive reactance loading said coaxial cavity, and
   - means for linearly varying only said bias voltage to change the reactance of said diode and the loading provided by said second tuned circuit and thus to linearly change the resonant frequency of said first tuned circuit and the operating frequency of the modulator.

References Cited

UNITED STATES PATENTS

| | | |
|---|---|---|
| 3,039,064 | 6/1962 | Dain et at. |
| 3,183,456 | 5/1965 | Seidel. |
| 3,229,229 | 1/1966 | Tozzi. |
| 3,286,194 | 11/1966 | Barkes. |
| 3,302,138 | 1/1967 | Brown et al. |
| 3,328,727 | 6/1967 | Lynk. |

OTHER REFERENCES

Sasaki: "Can Varactors Get Rid of F-M Distortion in Reflex Klystrons?" Aug. 3, 1962, Electronics, vol. 35, No. 31, pp. 42–45.

ALFRED L. BRODY, *Primary Examiner.*

U.S. Cl. X.R.

307—320; 331—36, 177; 333—73, 83; 334—15